United States Patent [19]
Ishida

[11] Patent Number: 5,400,355
[45] Date of Patent: Mar. 21, 1995

[54] SEMICONDUCTOR DOUBLE-CHANNEL-PLANAR-BURIED-HETEROSTRUCTURE LASER DIODE EFFECTIVE AGAINST LEAKAGE CURRENT

[75] Inventor: Tomoko Ishida, Tokyo, Japan
[73] Assignee: NEC Corporation, Tokyo, Japan
[21] Appl. No.: 217,174
[22] Filed: Mar. 24, 1994

[30] Foreign Application Priority Data

Mar. 25, 1993 [JP] Japan .................................. 5-066343
Mar. 25, 1993 [JP] Japan .................................. 5-066369

[51] Int. Cl.$^6$ .............................................. H01S 3/19
[52] U.S. Cl. ....................................... 372/46; 372/45
[58] Field of Search ................................... 372/46, 45

[56] References Cited

U.S. PATENT DOCUMENTS

| | | | |
|---|---|---|---|
| 4,805,178 | 2/1989 | Wilt | 372/46 |
| 4,833,684 | 5/1989 | Krekels et al. | 372/45 |
| 4,866,723 | 9/1989 | Van Dongen | 372/46 |
| 4,870,650 | 9/1989 | Mink | 372/46 |
| 4,910,744 | 3/1990 | Yoshida et al. | 372/46 |

OTHER PUBLICATIONS

"InGaAsP Double-Channel-Planar-Buried-heterostructure Laser Diode (DC-PBH LD) with current effective confinement", Journal of Lightwave Technology, vol. LT-1, No. 1, Mar. 1983 pp. 195–202.

"High-temperature operation of 1.55 μm InGaAsp Double-Channel Buried-Heterostructure Lasers Grown by LPE" by Electronics Letter 10th May 1984, vol. 20, No. 10 pp. 417–419.

"Modified double-channel planar-buried heterostructure laser with improved high-temperature stability" by J. Appl. Phys. 62 (1), 1 Jul. 1987, pp. 297–299.

Primary Examiner—Georgia Y. Epps
Attorney, Agent, or Firm—Sughrue, Mion, Zinn, Macpeak & Seas

[57] ABSTRACT

A semiconductor double-channel-planar-buried-heterostructure laser diode has a pair of double channel structures provided on both sides of a multiple quantum well structure for blocking leakage current, and the leakage current is decreased by a carrier density of a current blocking layer of each double channel structure ranging between $3 \times 10^{17}$ cm$^{-3}$ and $1 \times 10^{18}$ cm$^{-3}$ and equal to or less than a carrier density of a cladding layer on the multiple quantum well structure, a width of each double channel structure ranging between 3.0 microns and 5.0 microns or a width of the multiple quantum well structure ranging between 1.6 microns and 2.2 microns.

7 Claims, 9 Drawing Sheets

SEMICONDUCTOR DOUBLE-CHANNEL-PLANAR-BURIED-HETEROSTRUCTURE LASER DIODE EFFECTIVE AGAINST LEAKAGE CURRENT

FIELD OF THE INVENTION

This invention relates to a semiconductor double-channel-planar-buried-heterostructure laser diode and, more particularly, to a semiconductor double-channel-planar-buried-heterostructure laser diode available for an optical time domain reflectmeter or a fiber optics communication system.

DESCRIPTION OF THE RELATED ART

A typical example of the semiconductor double-channel-planar-buried-heterostructure laser diode is disclosed by Mito et al. in "InGaAsP Double-Channel-Planar-Buried-Heterostructure Laser Diode (DC-PBH LD) With Effective Current Confinement", Journal of Lightwave Technology, Vol. LT-1, No. 1, March 1983, pages 195 to 202, and FIG. 1 illustrates the prior art semiconductor double-channel-planar-buried-heterostructure laser diode. The prior art semiconductor double-channel-planar-buried-heterostructure laser diode is fabricated on a substrate 1 of n-type indium phosphide, and the substrate 1 is oriented to (001) direction.

According to the paper, on the substrate 1 are epitaxially grown n-type indium phosphide, indium gallium arsenic phosphide and p-type indium phosphide which form an n-type buffer layer 2, an active layer 3a, a quaternary layer 3 and a p-type cladding layer 4. The p-type cladding layer 4 is $5 \times 10^{17} \text{cm}^{-3}$ in carrier concentration. The epitaxial growth is carried out in liquid phase, and an intermediate laminated structure is obtained.

Using a photo-mask and Br-methanol solution, double channel forming regions 5 are formed in the intermediate laminated structure, and are spaced apart from each other. As a result, mesa stripes 6 are formed between the double channel forming regions 5. The double channel forming regions 5 are 7 microns in width and 3 microns in depth, and the mesa stripes 6 and the active region 3a thereof range from 1 micron to 3 microns in width.

On the intermediate laminated structure except for the mesa stripes 6 are epitaxially grown p-type indium phosphide and n-type indium phosphide which form a p-type current blocking layer 7 and an n-type current confining layer 8. The p-type current blocking layer 7 and the n-type current confining layer 8 extend over the double channel forming regions 5, and reach side surfaces of the mesa stripes 6. The epitaxial growth is also carried out in liquid-phase, and the current blocking layer 7 has a carrier concentration of $1 \times 10^{18} \text{cm}^{-3}$. After the formation of the p-type current blocking layer 7 and the n-type current confining layer 8, p-type indium phosphide and p-type indium gallium arsenic phosphide are further epitaxially grown on the entire surface of the structure. The p-type indium phosphide and the p-type indium gallium arsenic phosphide form a p-type embedding layer 9 and a p-type cap layer 10, respectively.

When an appropriate bias is applied, carriers are injected into the active region 3a, and are supplemented as a gate current. The carrier thus injected are recombined, and the prior art double-channel-planar-buried-heterostructure laser diode oscillates for producing a laser beam. The prior art double-channel-planar-buried-heterostructure laser diode achieves a light output power of 20 milli-watt at 85 degrees in centigrade at 90 to 105 milli-ampere.

While the double-channel-planar-buried-heterostructure laser diode is oscillating for producing the laser beam, the gate current is flowing from the p-type cladding layer 4 on the active region 3a into the p-type current blocking layer 7, and the p-n-p-n structure, i.e., the p-type embedding layer 9, the n-type current confining layer 8, the p-type current blocking layer 7 and the n-type buried layer 2, is expected to cut off the leakage current.

The double-channel-planar-buried-heterostructure laser diode is available as a high-power semiconductor laser emitting device for an optical time domain reflectmeter or a weatherproof semiconductor laser emitting device for a fiber optics communication system, and is expected to oscillate in a single fundamental transverse mode at minimum current consumption.

However, it is impossible to interrupt the gate current flowing into the p-type current blocking layer 7, and the p-n-p-n structure can not perfectly block the leakage current. As a result, the leakage current increases the current consumption, and the current consumption thus increased makes the threshold current for the oscillation high. The increased current consumption decreases the slope efficiency.

Especially, while the prior art double-channel-planar-buried-heterostructure laser diode is oscillating in high temperature environment, the p-type current blocking layer 7 is lowered in turn-on voltage, and the threshold current is further increased, and the slope efficiency is further decreased.

If the width of the active region 3a is equal to or greater than 1.5 microns, higher-order transverse modes tend to take place.

SUMMARY OF THE INVENTION

It is therefore an important object of the present invention provide a double-channel-planar-buried-heterostructure laser diode which oscillates at low current consumption.

To accomplish the object, the present invention proposes to regulate at least one of a channel width, the carrier density of a current blocking layer and the width of an active multiple quantum well structure to an appropriate range.

In accordance with the present invention, there is provided a semiconductor double-channel-planar-buried-heterostructure laser emitting device fabricated on a substrate, comprising: a) a buffer layer of a first compound semiconductor material of a first conductivity type laminated on the substrate; b) an active structure formed on the buffer layer for producing a laser beam; c) a cladding layer having a second conductivity type opposite to the first conductivity type, and formed of a second compound semiconductor material on the active structure; d) a pair of double channel structures provided on both sides of the active structure, and each having a current blocking layer of the second conductivity type formed of a third compound semiconductor material laminated on the buffer layer, the current blocking layer being held in contact with one of side surfaces of the cladding layer, and a current confining layer of the first conductivity type and formed of a fourth compound semiconductor material laminated on the current blocking layer; e) an embedding layer of the second conductivity type formed of a fifth compound semiconductor material, and covering the active structure and the pair of double channel structures; f) a cap layer of the second conductivity type and covering the embedding layer; and g) a leakage current blocking means for decreasing a leakage current flowing into both sides of the active structure, and selected from the group consisting of a carrier density of the current blocking layer ranging between $3 \times 10^{17}$ cm$^{-3}$ and $1 \times 10^{18}$ cm$^{-3}$ equal to or less than a carrier density of the cladding layer, a width of each of the double channel structures ranging between 3.0 microns and 5.0 microns, and a width of the active structure implemented by a multiple quantum well and ranging between 1.6 microns and 2.2 microns.

BRIEF DESCRIPTION OF THE DRAWINGS

The feature and advantages of the double-channel-planar-buried-heterostructure laser diode according to the present invention will be more clearly understood from the following description taken in conjunction with the accompanying drawings in which.

DESCRIPTION OF THE PREFERRED EMBODIMENTS

First Embodiment

Figure 2:
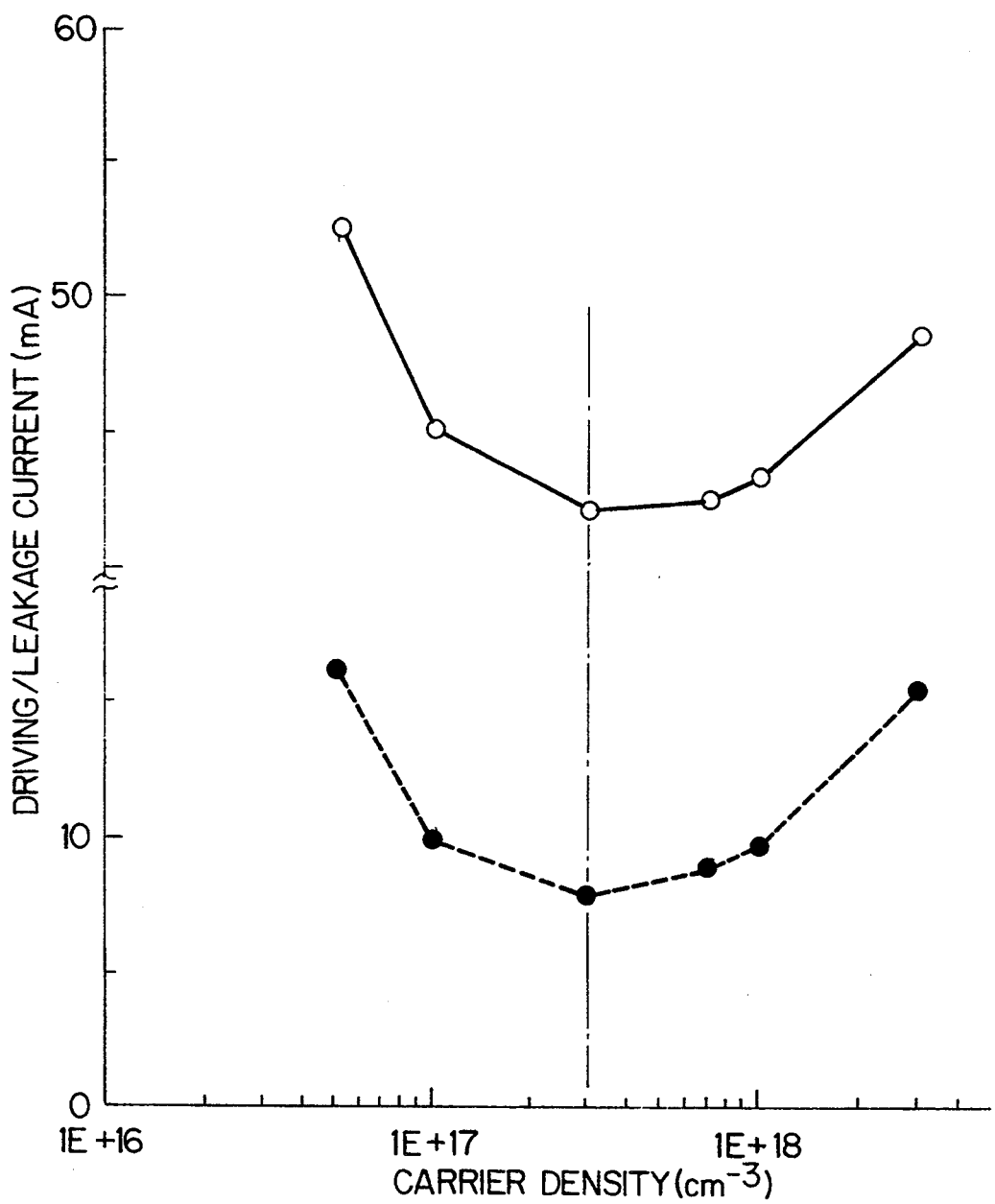
FIG. 2 is a graph showing relation between a driving-/leakage current and a carrier density of a current blocking layer simulated in an analysis for solving the problem inherent in the prior art semiconductor double-channel-planar-buried-heterostructure laser diode.

The present inventor firstly analyzed carrier concentration dependency of the gate current on a two-dimensional optical device simulator, and driving current consumed in the oscillation and leakage current were plotted in FIG. 2 on the assumption that a p-type cladding layer is $7 \times 10^{17}$ cm$^{-3}$ in carrier density. The object of the analysis was the double-channel-planar-buried-heterostructure laser diode the laminated structure of which was similar to the prior art double-channel-planar-buried-heterostructure laser diode. The axis of ordinates is indicative of the amount of current under the light output power of 5 milli-watt at 85 degrees in centigrade, and the abscissa stands for the carrier density of a p-type current blocking layer. The real line stand for the carrier concentration dependency of the driving current, and the broken line indicates the carrier concentration dependency of the leakage current. As will be seen from the plots, the carrier density at $3 \times 10^{17}$ cm$^{-3}$ minimizes both driving and leakage currents.

Figure 3:
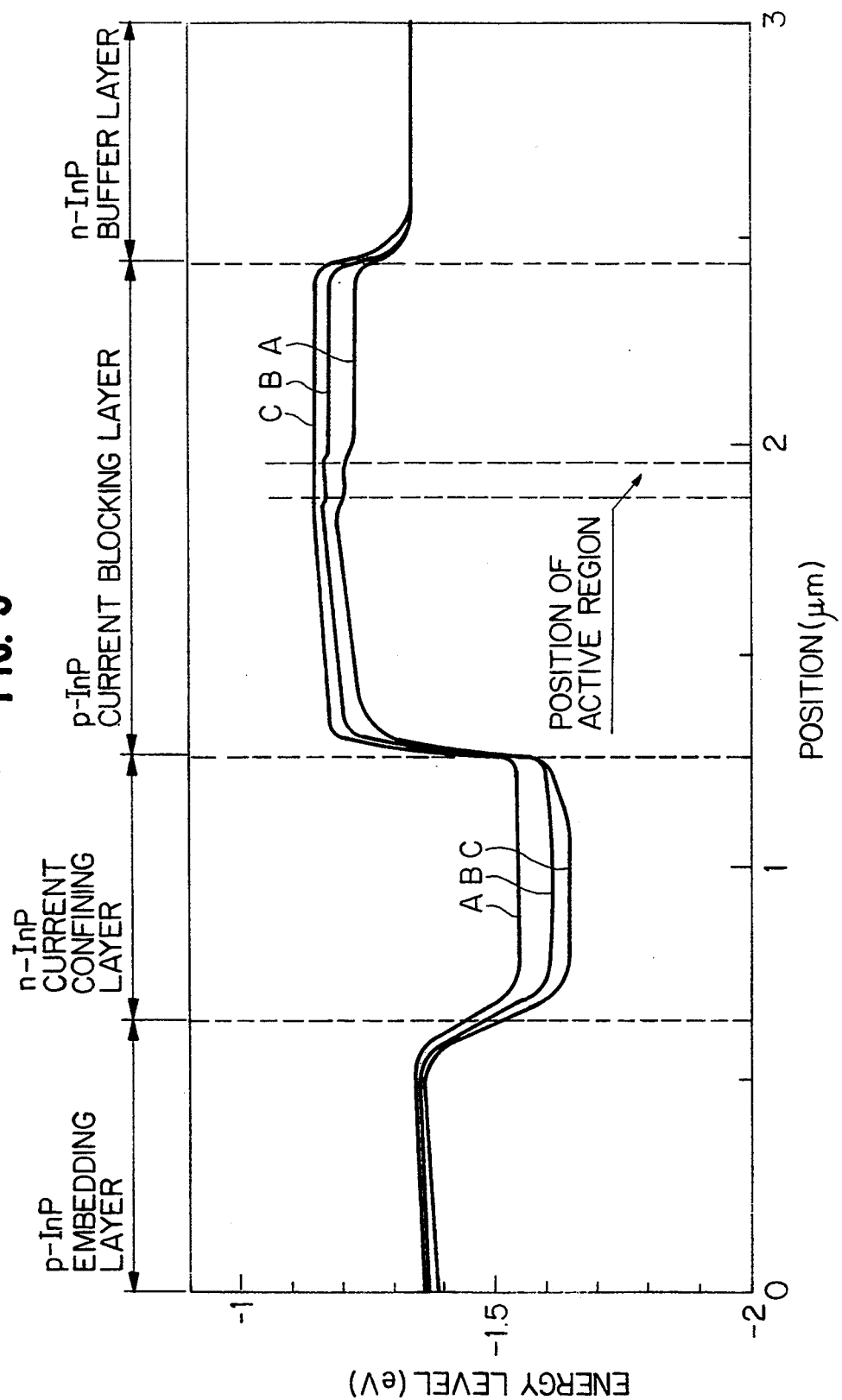
FIG. 3 is a graph showing the energy level at the upper edge of the valence band created in the semiconductor double-channel-planar-buried-heterostructure laser diode used in the analysis.

The present inventor further analyzed the energy band structure along a virtual plane 0.1 micron spaced from the side edge of an active region, and calculated the energy level at the upper edge of the valence band along the virtual plane under the light output power of 5 milli-watt at 85 degrees in centigrade. The energy level was plotted in FIG. 3. Plots A, B and C are indicative of the calculated upper edges on the assumption that the p-type current blocking layer are $5 \times 10^{16}$ cm$^{-3}$, $3 \times 10^{17}$ cm$^{-3}$ and $1 \times 10^{18}$ cm$^{-3}$ respectively.

If the carrier concentration of the p-type blocking layer is as low as the order to $5 \times 10^{16}$ cm$^{-3}$ only small potential gaps are produced at the p-n junctions on both sides of the current blocking layer, and allow the leakage current to be much liable to flow. If the carrier density of the p-type current blocking layer is increased to $3 \times 10^{17}$ cm$^{-3}$ the potential gap is increased The smaller the potential gap, the more the hole current flowing into the current blocking layer.

Figure 4:
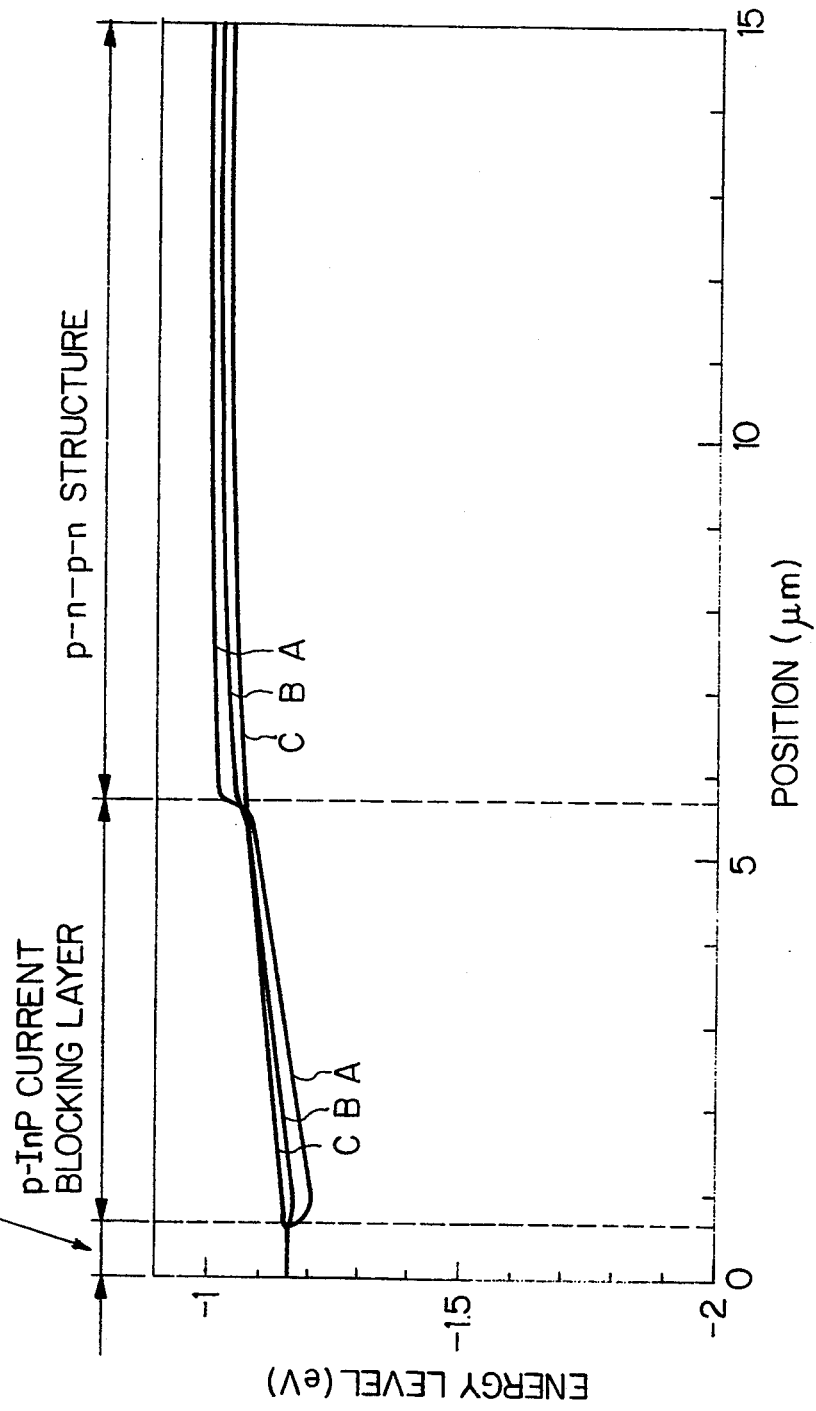
FIG. 4 is a graph showing the energy level at the upper edge of the valence band along a different cross section of the semiconductor double-channel-planar-buried-heterostructure laser diode.

FIG. 4 illustrates the energy level at the upper edge of the valence band along a horizontal virtual plane 0.1 micron over the active region under the light output power of 5 milli-watt at 85 degrees in centigrade. If the carrier density of the p-type current blocking layer is increased, the potential gap with the p-type cladding layer is decreased, and hole current is much liable to flow thereinto.

The present inventor concludes that the p-type cladding layer of the mesa stripe had to be equal to or higher in carrier density than the p-type current blocking layer with carrier density ranging between $3 \times 10^{17}$ cm$^{-3}$ and $1 \times 10^{18}$ cm$^{-3}$ for decreasing the leakage current. The reason for the carrier density range is the dispersion of the driving current at about 1 milliampere.

Figure 5:
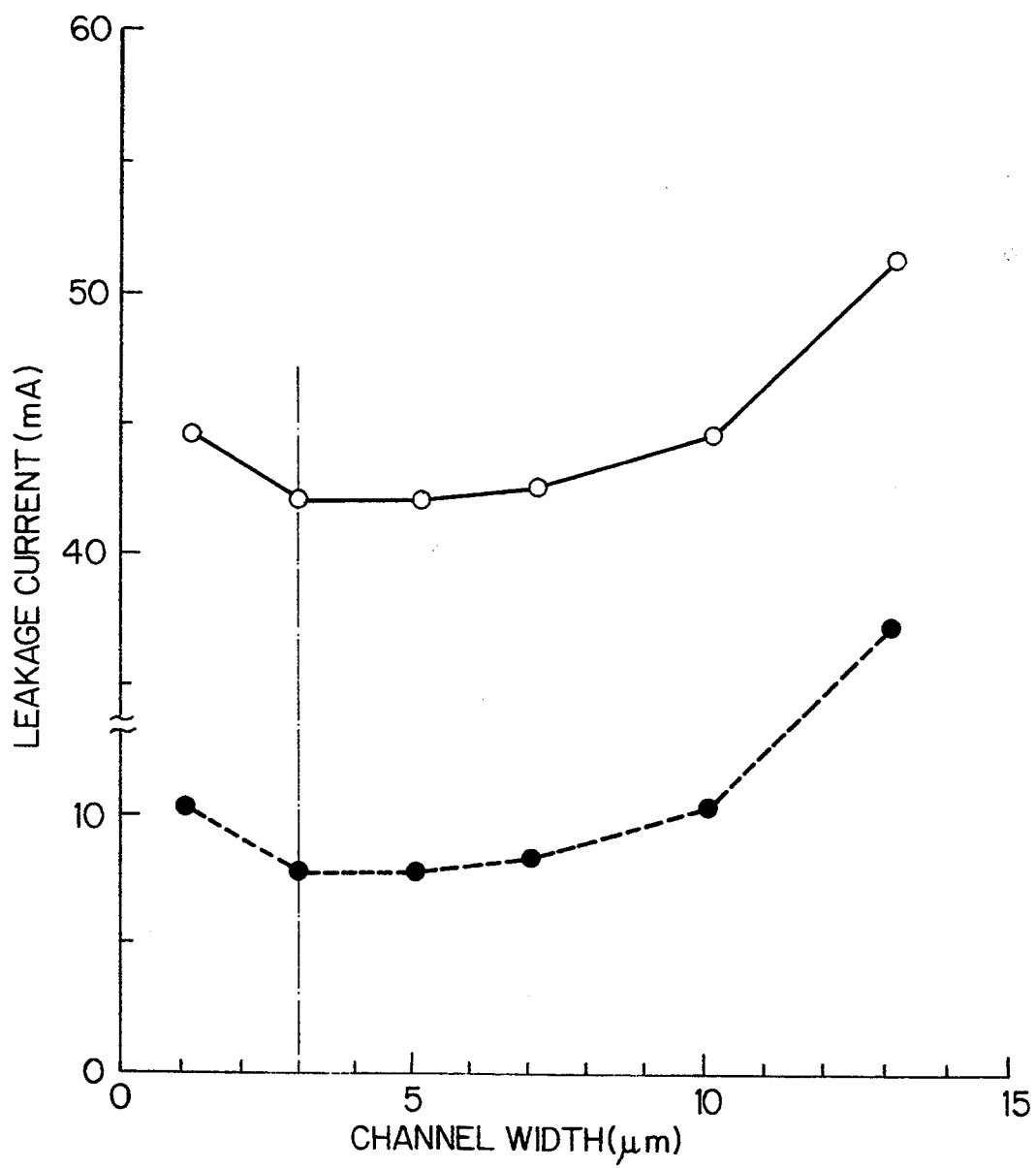
FIG. 5 is a graph showing relation between a driving-/leakage current and a channel-width simulated in an analysis for solving the problem inherent in the prior art semiconductor double-channel-planar-buried-heterostructure laser diode.
Figure 6:
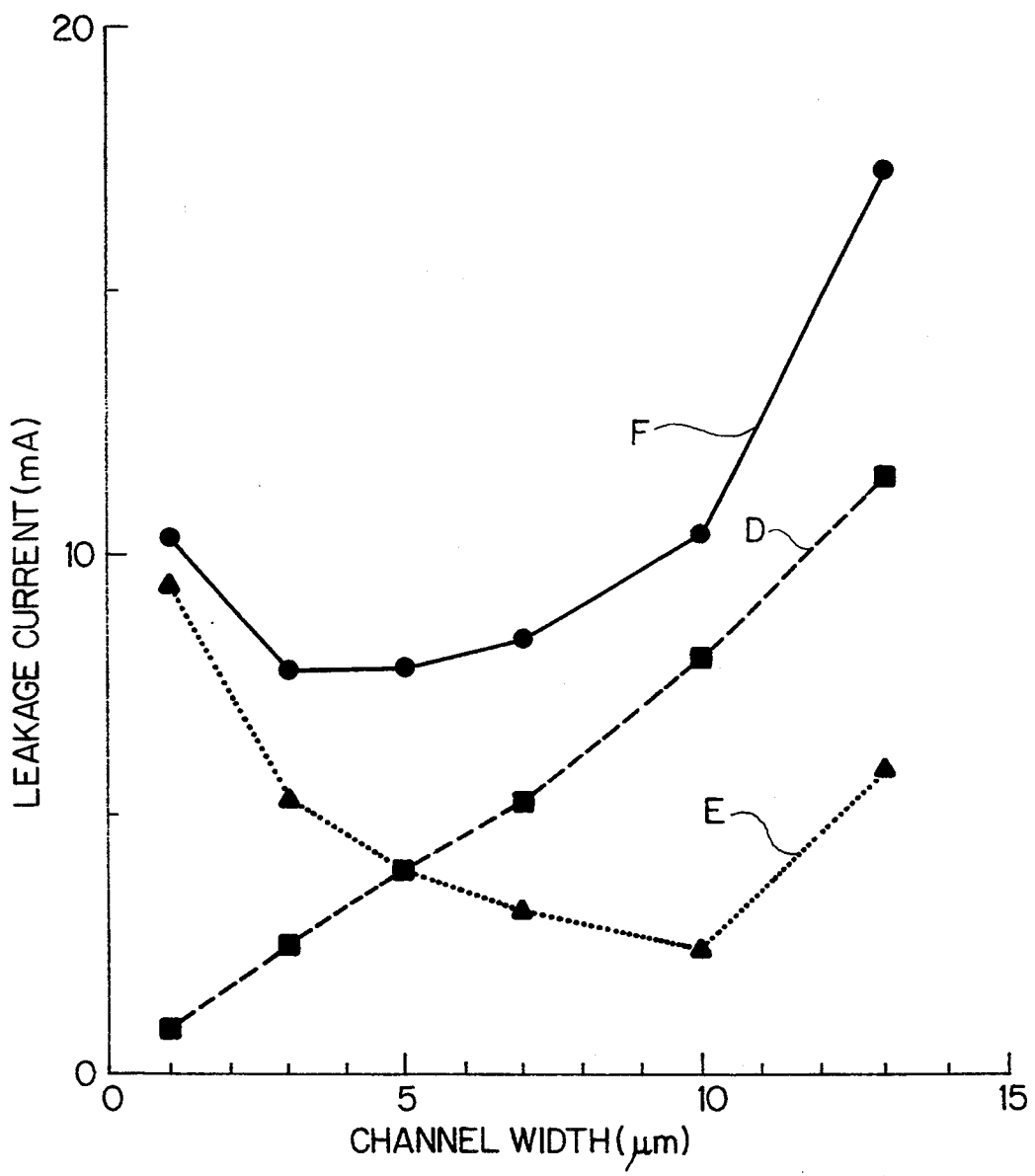
FIG. 6 is a graph showing leakage currents respectively flowing into the double channel and the p-n-p-n structures on both sides of the active region.

The present inventor further analyzed channel-width dependency of the leakage current. In the following description, "channel width" is measured at the opening of a double channel region. In FIG. 5, plots on the real line is indicative of the driving current in terms of the channel-width under the light output power of 5 milli-watt at 85 degrees in centigrade, and plots on the broken line is indicative of the leakage current under the same conditions. Both driving and leakage current is minimized at the channel-width of 3 microns, and both wider and narrower channels increase the driving and leakage currents.

The leakage current was broken down into leakage sub-current D flowing through the double channel and leakage sub-current E flowing into the quaternary layers on both sides of the p-type current blocking layers under the light output power of 5 milli-watt at 85 degrees in centigrade. Plots F stands for the total leakage current. The leakage sub-current D is linearly increased together with the channel width. However, the leakage sub-current E is minimized at the channel width of 10 microns, and both wider and narrower channels increase the leakage sub-current E.

The hole current flowing into the p-type current blocking layer tries to flow into the quaternary layers on both sides thereof because of the low potential level. However, a wider channel increases the distance from the p-type cladding layer on the active region to the quaternary layers, and, accordingly, the resistance along the current path is increased. As a result, the leakage current flowing into the p-type current blocking layer passes through the double channel, and flows into the n-type substrate.

The leakage current D serves as a gate current of the p-n-p-n structures, and the increased gate current lowers the turn-on voltage of the p-n-p-n structures, and the p-n-p-n structures in on-state increases the total leakage current.

On the other hand, if the distance between the p-type cladding layer and the quaternary layers is decreased, and the resistance is, accordingly, decreased. As a result, the leakage current flows into the quaternary layers, and the leakage sub-current E is increased.

The present inventor concludes that the channel ranging between 3.0 microns and 5.0 microns improves high temperature characteristics of the semiconductor double-channel-planar-buried-heterostructure laser diode.

Figure 1:
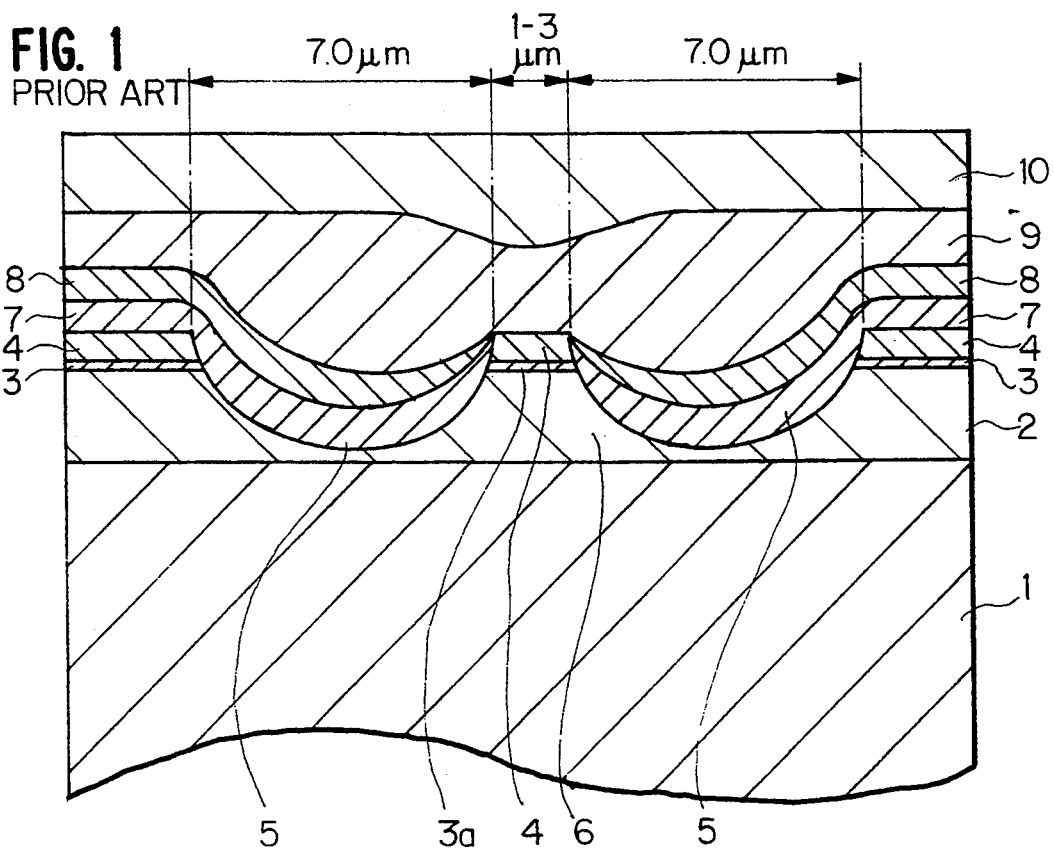
FIG. 1 is a cross sectional view showing the structure of the prior art semiconductor double-channel-planar-buried-heterostructure laser diode.
Figure 7:
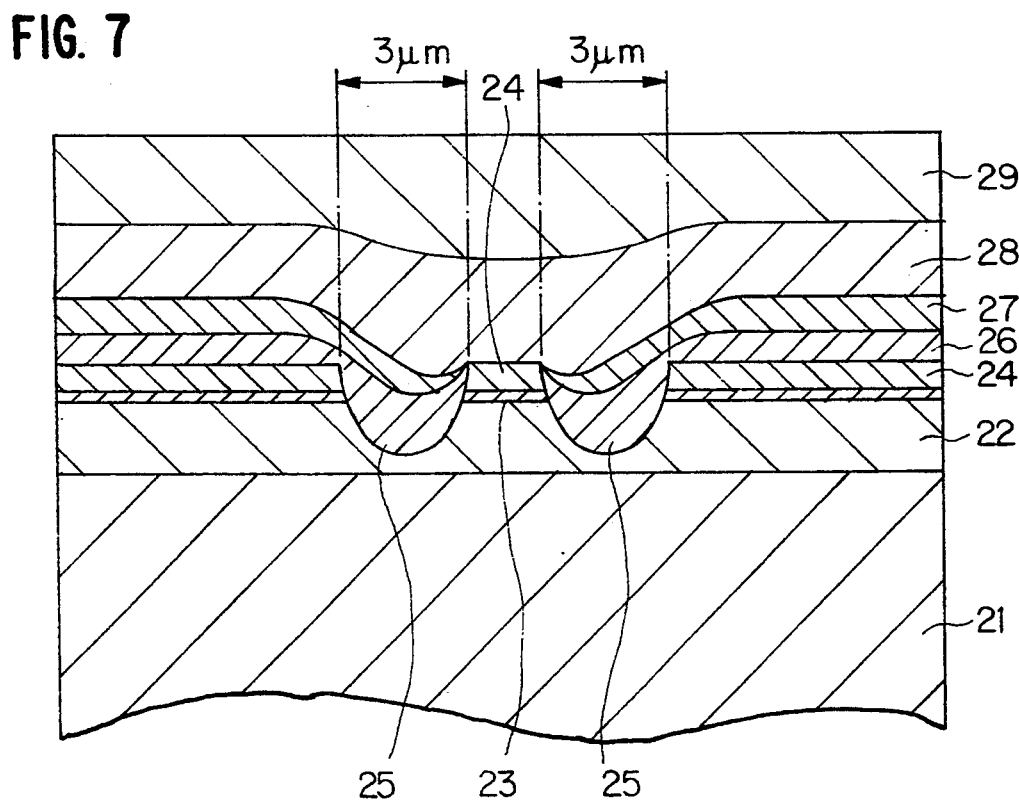
FIG. 7 is a cross sectional view showing the structure of a semiconductor double-channel-planar-buried-heterostructure laser diode.

FIG. 7 illustrates a semiconductor double-channel-planar-buried-heterostructure laser diode embodying the present invention on the basis of the above described analysis. The semiconductor double-channel-planar-buried-heterostructure laser diode is fabricated on a substrate 21 formed of n-type indium phosphide, and the substrate 21 is oriented to (001) direction.

N-type indium phosphide is epitaxially grown on the major surface of the substrate 21, and silicon is doped at $1.2 \times 10^{18}$ cm$^{-3}$. The silicon-doped n-type indium phosphide layer serves as a buffer layer 22, and the buffer layer is 0.5 micron in thickness.

On the buffer layer 22 are successively grown indium gallium arsenic phosphide doped with silicon at $1.2 \times 10^{18}$ cm$^{-3}$ intentionally undoped indium gallium arsenide phosphide and intentionally undoped indium gallium arsenic phosphide which respectively serve as an SCH (Seperated-Confinement-Heterostructure) layer for laser light with 1.13 microns wavelength composition, a well for laser light with 1.40 microns wavelength composition and a barrier layer for laser light with 1.13 microns wavelength composition. The SCH layer, the well and the barrier layer are 600 angstroms thick, 57 angstroms thick and 100 angstroms thick, respectively, and form parts of an active multiple quantum well structure 23 having seven quantum wells. P-type indium phosphide doped with zinc at $7 \times 10^{17}$ cm$^{-3}$ is further grown to 0.6 micron thick on the active multiple quantum well structure 23, and serves as a p-type cladding layer 24.

In this instance, an organo-metallic vapor phase epitaxy is used for the lamination of the buffer layer 22, the active multiple quantum well structure 23 and the cladding layer 24. However, a liquid-phase epitaxy and a molecular beam epitaxy are available for the lamination.

A stripe mask is patterned on the upper surface of the lamination, and defines a mesa structure and double channel regions 25. The mesa structure has a center-to-center distance at 3.2 microns, and the double channel regions 25 are 1.0 micron in width. Using the stripe mask, the lamination is partially etched away in Br-methanol solution, and the mesa structure is formed between the double channel regions 25. In this instance, the width of the double channel regions 25 is regulated to 3.0 microns at respective openings.

Using a liquid-phase epitaxy, p-type indium phosphide doped with zinc at $3 \times 10^{17}$ cm$^{-3}$ and n-type indium phosphide doped with silicon at $7 \times 10^{17}$ cm$^{-3}$ are successively grown on the partially etched lamination, and the double channel regions 25 are buried in the p-type indium phosphide layer and the n-type indium phosphide layer. The p-type indium phosphide layer and the n-type indium phosphide layer serve as a p-type current blocking layer 26 and an n-type current confining layer 27, respectively. The p-type current blocking layer 26 and the n-type current confining layer 27 in the double channel regions 25 as a whole constitute a pair of double channel structures.

Subsequently, p-type indium phosphide and p-type indium gallium arsenic phosphide are successively grown through, for example, a liquid-phase epitaxial process on the n-type current confining layer 27, and serve as a p-type embedding layer 28 and a p-type cap layer 29, respectively.

Finally, a pair of electrodes (not shown) is patterned on the p-side and on the n-side, and the semiconductor double-channel-planar-buried-heterostructure laser diode is completed.

The present inventor appropriately biased the semiconductor double-channel-planar-buried-heterostructure laser diode thus arranged, and confirmed that the semiconductor double-channel-planar-buried-heterostructure laser diode oscillated for producing a laser beam. The current consumption was 85 milli-ampere under the light output power of 20 milli-watt at 85 degrees in centigrade, and was 5 milli-ampere smaller than that of the prior art semiconductor double-channel-planar-buried-heterostructure laser diode.

The semiconductor double-channel-planar-buried-heterostructure laser diode is fabricated in InGaAsP/InP system. However, AlGaAs/GaAs system is available for a semiconductor double-channel-planar-buried-heterostructure laser diode according to the present invention.

As will be appreciated from the foregoing description, the foregoing description, the current blocking layer doped ranging between $3 \times 10^{17}$ cm$^{-3}$ and $1 \times 10^{18}$ cm$^{-3}$ and equal to or less than the cladding layer is effective against the leakage current, and the channel width between 3.0 microns and 5.0 microns is also effective against the leakage current.

Second Embodiment

Figure 8:
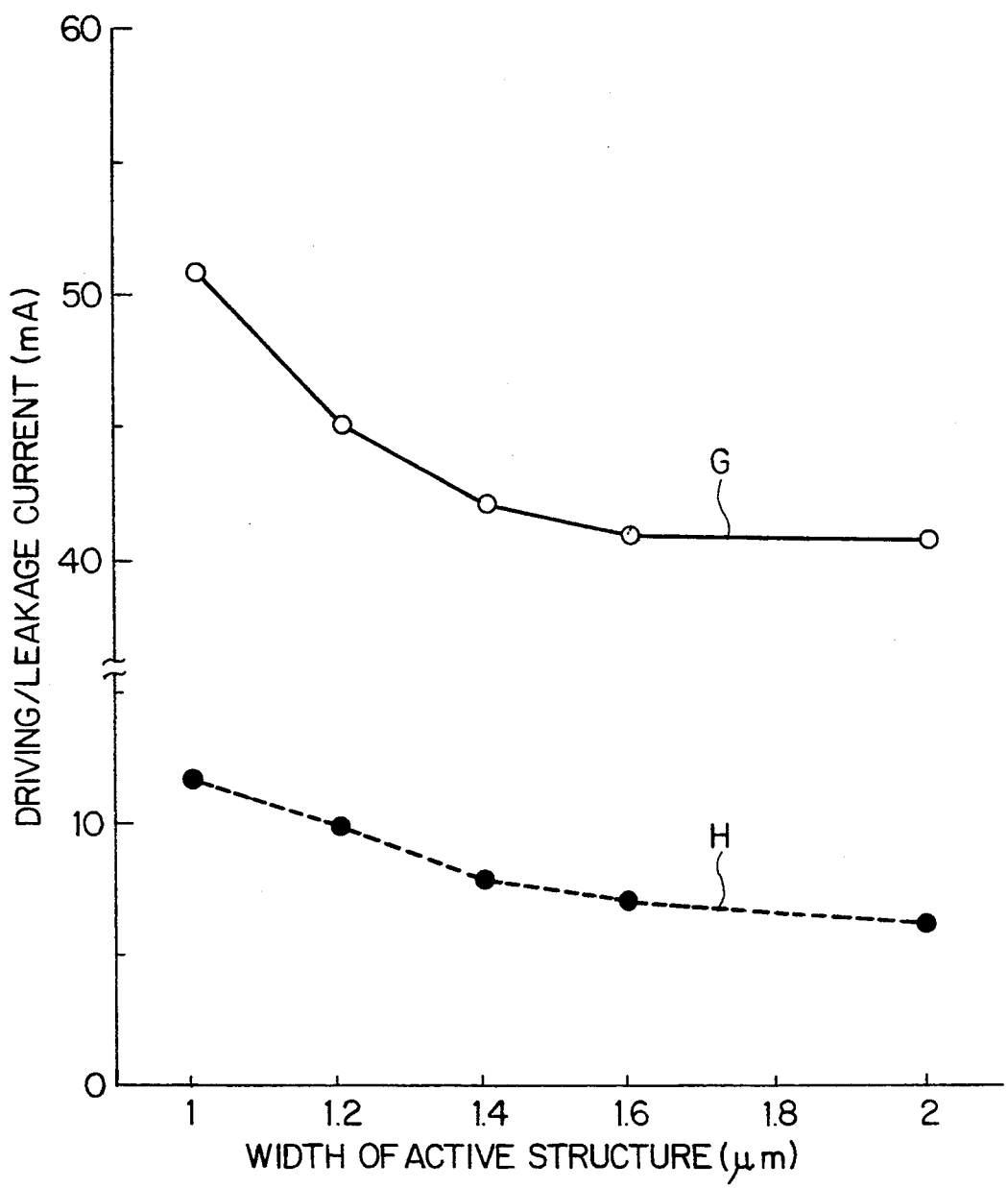
FIG. 8 is a graph showing driving/leakage current in terms of the width of an active layer width.

The present inventor analyzed the leakage current in terms of the width of an active structure by using the two-dimensional optical device simulator, and plotted driving current G and leakage current H in FIG. 8. The active structure was assumed to be an active multiple quantum well structure, and the width of the active structure ranged from 1.0 micron to 2.0 micron. Though not shown in FIG. 8, the driving current and the leakage current are assumed to be inversely decreased to the width of the active structure outside of 2.0 microns. The leakage current is minimized under the active structure width equal to or greater than 1.6 microns.

When the width of the active structure is increased, both driving and leakage currents are decreased. This phenomenon is derived from increase of the optical confinement factor. Namely, if the width of the active structure is increased, the optical confinement factor is also increased. This results in decrease of the leakage current. If the leakage current is decreased, the driving current is also decreased. The reason why the increase of the active structure with decreases the leakage current is that the decrease of the resistance of the active structure allows current to flow thereinto. In other words, the low resistance decreases current flowing from the cladding layer into the current blocking layer.

Figure 9:
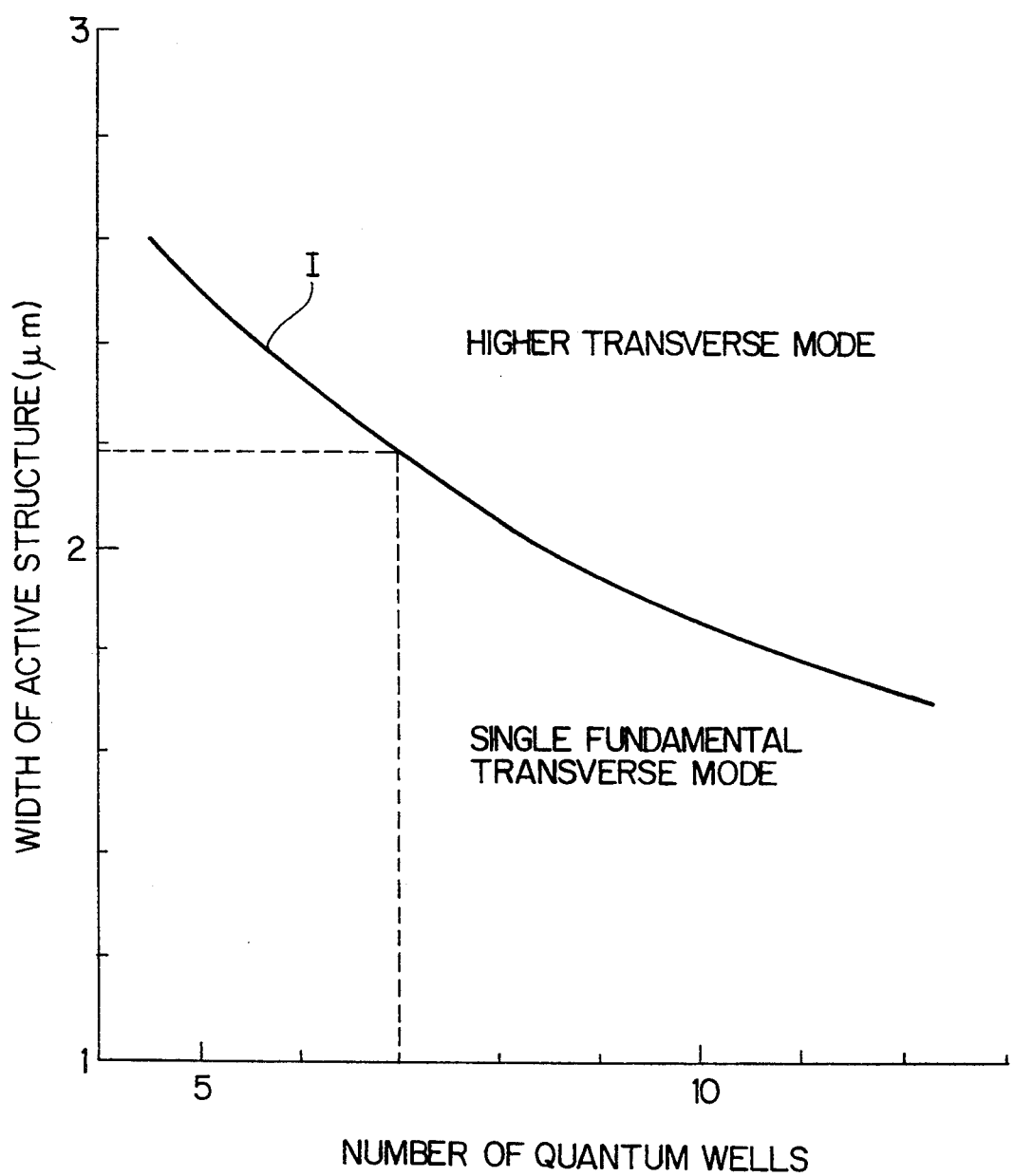
FIG. 9 is a graph showing the oscillation mode of a laser diode in terms of the number of quantum wells incorporated in a semiconductor double-channel-buried-heterostructure laser diode.

The present inventor measured the transverse mode of a laser produced by the semiconductor double-channel-buried-heterostructure laser diode in terms of the width of the active structure, and found a boundary I between the higher transverse mode and the single fundamental transverse mode in FIG. 9. In general, a wider active structure is desirable, and the width of the active structure is inversely proportional to the number of quantum wells incorporated in the active structure. If the number of quantum wells is seven, the laser beam produced by an active structure of 2.2 wider than 2.2 micron tends to oscillate in the higher transverse mode. In other words, the upper limit of the active structure width is 2.2 microns.

As described hereinbefore, a wider active structure is effective against the leakage current. However, the oscillation mode sets a limit on the width of the active structure, and the optimum width falls into a range between 1.6 microns and 2.2 microns for the active structure having seven quantum wells.

By the way, the prior art semiconductor double-channel-buried-heterostructure laser diode oscillates in the single fundamental transverse mode only when the width of the active structure is equal to or less than 1.5 microns.

The present inventor confirmed that the current density at the threshold did not depend on the width of the active structure.

The present inventor concludes that the multiple quantum well structure ranging between 1.6 microns and 2.2 microns wide oscillates in the single fundamental transverse mode and improves high temperature characteristics of the laser diode.

Figure 10:
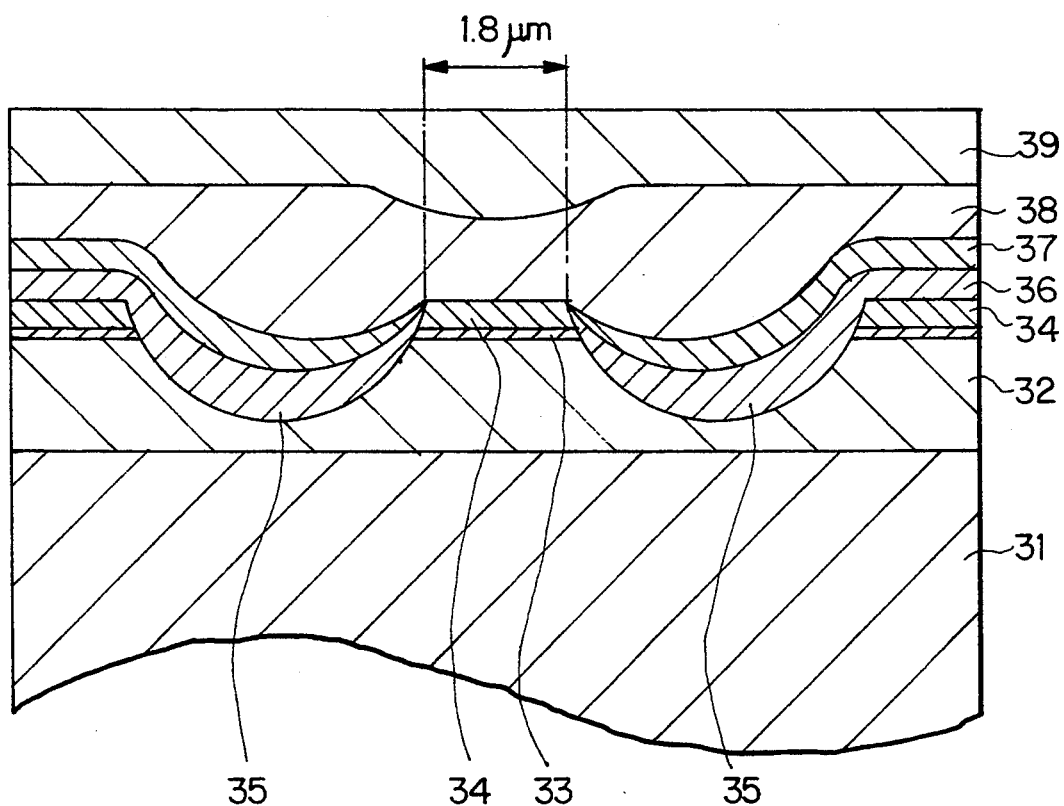
FIG. 10 is a cross sectional view showing the structure of another semiconductor double-channel-buried-heterostructure laser diode according to the present invention.

Turning to FIG. 10 of the drawings, a semiconductor double-channel-buried-heterostructure laser diode embodying the present invention is fabricated on a substrate 31 of n-type indium phosphide oriented to (001) direction, and is in InGsAsP/InP system. Using organo-metallic vapor phase epitaxy, an n-type buffer layer 32, a multiple quantum well structure 33 and a cladding layer 34 are formed on the substrate 31. Namely, n-type indium phosphide doped with silicon at $1.2 \times 10^{18}$ cm$^{-3}$ is grown to 0.5 micron on the substrate 31, and the n-type indium phosphide layer serves as the buffer layer 32. N-type indium gallium arsenic phosphide doped with silicon at $1.2 \times 10^{18}$ cm$^{-3}$ is grown to 600 angstroms thick, and the n-type indium gallium arsenic phosphide layer serves as an SCH layer for a laser with 1.13 micron wavelength composition. Intentionally undoped indium gallium arsenic phosphide is grown to 57 angstroms thick, and the intentionally undoped gallium arsenide phosphide layer serves as a well layer for a laser with 1.40 micron wavelength composition. Intentionally undoped indium gallium arsenic phosphide is grown to 100 angstroms thick, and the intentionally undoped indium gallium arsenic phosphide layer serves as a barrier layer for a laser with 1.13 micron wavelength composition. The SCH layer, the well layer and the barrier layer form parts the active multiple quantum well structure 33 with seven quantum wells. P-type indium phosphide doped with zinc at $7 \times 10^{17}$ cm$^{-3}$ is further grown to 0.6 micron thick, and the p-type indium phosphide layer serves as the p-type cladding layer 34. In this instance, the organo-metallic vapor phase epitaxy is used for the lamination of the buffer layer 32, the active multiple quantum well structure 33 and the cladding layer 34. A liquid-phase epitaxy or a molecular beam epitaxy is available for the lamination.

A stripe mask is patterned on the upper surface of the lamination, and defines a mesa structure and double channel regions 35. The mesa structure has a center-to-center distance at 5.4 microns, and the double channel regions 25 are 3.0 micron in width. Using the stripe mask, the lamination is partially etched away in Br-methanol solution, and the mesa structure is formed between the double channel regions 35. In this instance, the width of the active multiple quantum well structure 34 is regulated to 1.8 microns.

Using a liquid-phase epitaxy, p-type indium phosphide and n-type indium phosphide doped are successively grown on the partially etched lamination, and the double channel regions 35 are buried in the p-type indium phosphide layer and the n-type indium phosphide layer. The p-type indium phosphide layer and the n-type indium phosphide layer serve as a p-type current blocking layer 36 and an n-type current confining layer 37, respectively. The p-type current blocking layer 36 and the n-type current confining layer 37 in the double channel regions 35 as a whole constitute a pair of double channel structures.

Subsequently, p-type indium phosphide and p-type indium gallium arsenic phosphide are successively grown through, for example, a liquid-phase epitaxial process on the n-type current confining layer 37, and serve as a p-type embedding layer 38 and a p-type cap layer 39, respectively.

Finally, a pair of electrodes (not shown) is patterned on the p-side and on the n-side, and the semiconductor double-channel-planar-buried-heterostructure laser diode is cut out. The length of the diode is 300 microns. A high-reflection film at 70 per cent is coated on the rear surface.

The present inventor evaluated the semiconductor double-channel-planar-buried-heterostructure laser diode, and measured the current consumption under the light output power of 20 milli-watt at 85 degrees in centigrade. The current consumption was 80 milli-ampere, and the high temperature characteristics was decreased by more than 10 milli-ampere rather than the current consumption of the prior art semiconductor double-channel-planar-buried-heterostructure laser diode ranging between 90 milli-ampere and 105 milli-ampere.

As will be appreciated from the foregoing description, the semiconductor double-channel-planar-buried-heterostructure laser diode according to the present invention effectively decreases the leakage current by regulating the carrier density of the current blocking layer, the channel width or the active structure width, and, accordingly, restricts the heat generated in the active structure. Therefore, the semiconductor double-channel-planar-buried-heterostructure laser diode is available for a high-power semiconductor laser emitting device for an optical time domain reflectmeter or a weatherproof semiconductor laser emitting device for a fiber optics communication system.

Although particular embodiments of the present invention have been shown and described, it will be obvious to those skilled in the art that various changes and modifications may be made without departing from the spirit and scope of the present invention.

What is claimed is:

1. A semiconductor double-channel-planar-buried-heterostructure laser emitting device fabricated on a substrate, comprising:
   a) a buffer layer of a first compound semiconductor material of a first conductivity type laminated on said substrate;
   b) an active structure formed on said buffer layer for producing a laser beam;
   c) a cladding layer having a second conductivity type opposite to said first conductivity type, and formed of a second compound semiconductor material on said active structure;
   d) a pair of double channel structures provided on both sides of said active structure, and each having
      a current blocking layer of said second conductivity type formed of a third compound semiconductor material laminated on said buffer layer, said current blocking layer being held in contact with one of side surfaces of said cladding layer, and
      a current confining layer of said first conductivity type and formed of a fourth compound semiconductor material laminated on said current blocking layer;
   e) an embedding layer of said second conductivity type formed of a fifth compound semiconductor material, and covering said active structure and said pair of double channel structures;
   f) a cap layer of said second conductivity type and covering said embedding layer; and
   g) a leakage current blocking means for decreasing a leakage current flowing from said active structure, and selected from the group consisting of
      a carrier density of said current blocking layer ranging between $3 \times 10^{17}$ cm$^{-3}$ and $1 \times 10^{18}$ cm$^{-3}$ and equal to or less than a carrier density of said cladding layer,
      a width of each of said double channel structures ranging between 3.0 microns and 5.0 microns, and
      a width of said active structure implemented by a multiple quantum well and ranging between 1.6 microns and 2.2 microns.

2. The semiconductor double-channel-planar-heterostructure laser emitting device as set forth in claim 1, in which said first, second, third, fourth and fifth compound semiconductor materials are n-type indium phosphide, p-type indium phosphide, p-type indium phosphide, n-type indium phosphide and p-type indium phosphide.

3. A semiconductor double-channel-planar-buried-heterostructure laser emitting device fabricated on a substrate, comprising:
   a) a buffer layer formed of an n-type indium phosphide, and laminated on said substrate;
   b) an active structure formed on said buffer layer for producing a laser beam;
   c) a cladding layer formed of a p-type indium phosphide, and laminated on said active structure;
   d) a pair of double channel structures provided on both sides of said active structure, and each having
      a current blocking layer formed of a p-type indium phosphide, and laminated on said buffer layer, said current blocking layer being held in contact with one of side surfaces of said cladding layer, said current blocking layer having a carrier density ranging between $3 \times 10^{17}$ cm$^{-3}$ and $1 \times 10^{18}$ cm$^{-3}$ and equal to or less than a carrier density of said cladding layer, and
      a current confining layer formed of an n-type indium phosphide, and laminated on said current blocking layer;
   e) an embedding layer of formed of a p-type indium phosphide, and covering said active structure and said pair of double channel structures; and
   f) a cap layer of a p-type indium gallium arsenic phosphide and covering said embedding layer.

4. A semiconductor double-channel-planar-buried-heterostructure laser emitting device fabricated on a substrate, comprising:
   a) a buffer layer formed of an n-type indium phosphide, and laminated on said substrate;
   b) an active structure formed on said buffer layer for producing a laser beam;
   c) a cladding layer formed of a p-type indium phosphide, and laminated on said active structure;
   d) a pair of double channel structures provided on both sides of said active structure, and having a width ranging between 3.0 microns and 5.0 microns, each of said double channel structures having
      a current blocking layer formed of a p-type indium phosphide, and laminated on said buffer layer, said current blocking layer being held in contact with one of side surfaces of said cladding layer, and
      a current confining layer formed of an n-type indium phosphide, and laminated on said current blocking layer;
   e) an embedding layer of formed of a p-type indium phosphide, and covering said active structure and said pair of double channel structures; and
   f) a cap layer of a p-type indium gallium arsenic phosphide and covering said embedding layer.

5. A semiconductor double-channel-planar-buried-heterostructure laser emitting device fabricated on a substrate, comprising:
   a) a buffer layer formed of an n-type indium phosphide, and laminated on said substrate;
   b) an active structure formed on said buffer layer for producing a laser beam;
   c) a cladding layer formed of a p-type indium phosphide, and laminated on said active structure;
   d) a pair of double channel structures provided on both sides of said active structure, and having a width ranging between 3.0 microns and 5.0 microns, each of said double channel structures having
      a current blocking layer formed of a p-type indium phosphide, and laminated on said buffer layer, said current blocking layer being held in contact with one of side surfaces of said cladding layer, said current blocking layer having a carrier density ranging between $3 \times 10^{17}$ cm$^{-3}$ and $1 \times 10^{18}$ cm$^{-3}$ and equal to or less than a carrier density of said cladding layer, and a current confining layer formed of an n-type indium phosphide, and laminated on said current blocking layer;

e) an embedding layer of formed of a p-type indium phosphide, and covering said active structure and said pair of double channel structures; and f) a cap layer of a p-type indium gallium arsenic phosphide and covering said embedding layer.

6. A semiconductor double-channel-planar-buried-heterostructure laser emitting device fabricated on a substrate, comprising:

a) a buffer layer formed of an n-type indium phosphide, and laminated on said substrate;

b) an active structure formed on said buffer layer for producing a laser beam, and implemented by a multiple quantum well structure having a width not less than 1.6 microns and not greater than a critical value for allowing said laser beam to oscillate in a single fundamental transversal mode;

c) a cladding layer formed of a p-type indium phosphide, and laminated on said active structure;

d) a pair of double channel structures provided on both sides of said active structure, and each having a current blocking layer formed of a p-type indium phosphide, and laminated on said buffer layer, said current blocking layer being held in contact with one of side surfaces of said cladding layer, and a current confining layer formed of an n-type indium phosphide, and laminated on said current blocking layer;

e) an embedding layer of formed of a p-type indium phosphide, and covering said active structure and said pair of double channel structures; and f) a cap layer of a p-type indium gallium arsenic phosphide and covering said embedding layer.

7. The semiconductor double-channel-planar-buried-heterostructure laser emitting device as set forth in claim 6, in which said critical value is 2.2 microns when said multiple quantum well structure has seven quantum wells.

* * * * *